United States Patent
Azami et al.

(10) Patent No.: US 10,270,017 B2
(45) Date of Patent: Apr. 23, 2019

(54) LAMINATE FILM, METHOD FOR PRODUCING LAMINATE FILM, AND LED-MOUNTED SUBSTRATE

(71) Applicant: SUMITOMO CHEMICAL COMPANY, LIMITED, Tokyo (JP)

(72) Inventors: Shohei Azami, Tsukuba (JP); Masanobu Matsubara, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 36 days.

(21) Appl. No.: 15/485,645

(22) Filed: Apr. 12, 2017

(65) Prior Publication Data

US 2017/0301840 A1     Oct. 19, 2017

(30) Foreign Application Priority Data

Apr. 14, 2016   (JP) ................... 2016-081214

(51) Int. Cl.
*H01L 33/00* (2010.01)
*H01L 33/60* (2010.01)
(Continued)

(52) U.S. Cl.
CPC ............ *H01L 33/60* (2013.01); *B32B 5/18* (2013.01); *B32B 27/06* (2013.01); *B32B 27/36* (2013.01);
(Continued)

(58) Field of Classification Search
CPC ....... H01L 33/60; H01L 33/62; C08G 63/605; B32B 5/18; B32B 27/06; B32B 27/36;
(Continued)

(56) References Cited

U.S. PATENT DOCUMENTS

2004/0081901 A1* 4/2004 Egusa .............. G03G 13/01
430/45.5
2010/0301725 A1  12/2010 Matsui et al.
(Continued)

FOREIGN PATENT DOCUMENTS

WO    2009/069741 A1    6/2009

*Primary Examiner* — Ismail A Muse
(74) *Attorney, Agent, or Firm* — Sughrue Mion, PLLC

(57) ABSTRACT

The present invention relates to a laminate film including a resin layer having a thickness of from 10 μm to 125 μm; and a toner layer formed on one surface of the resin layer, in which the resin layer is formed from a resin material having a glass transition temperature of 130° C. or higher, the toner layer has a plurality of voids, and when a value defined by the following formula (S1) using the void area ratio, which represents the ratio of the area of exposed voids, for the respective faces of the surface of the toner layer and a cross section of the toner layer, is designated as porosity, and when two void area ratios respectively corresponding to the cross sections of the toner layer in two orthogonally intersecting directions are used as the void area ratios of the cross sections of the toner layer, the porosities respectively calculated according to the two void area ratios are both from 0.01% to 0.40%.

$$\text{Porosity (\%)} = \frac{\text{Void area ratio of cross section (\%)}}{100} \times \frac{\text{Void area ratio of surface (\%)}}{100} \times 100 \quad (S1)$$

8 Claims, 1 Drawing Sheet

(51) Int. Cl.
*B32B 5/18* (2006.01)
*B32B 27/06* (2006.01)
*B32B 27/36* (2006.01)
*C08G 63/60* (2006.01)
*C08J 5/18* (2006.01)
*C09K 19/38* (2006.01)
*H01L 33/62* (2010.01)

(52) U.S. Cl.
CPC .............. *C08G 63/605* (2013.01); *C08J 5/18* (2013.01); *C09K 19/3809* (2013.01); *B32B 2305/026* (2013.01); *B32B 2305/55* (2013.01); *B32B 2457/14* (2013.01); *C08J 2367/00* (2013.01); *H01L 33/62* (2013.01); *H01L 2224/48091* (2013.01); *H01L 2224/48227* (2013.01)

(58) Field of Classification Search
CPC ............ B32B 2305/55; B32B 2457/14; B32B 2305/026; C09K 19/3809; C08J 5/18; C08J 2367/00
See application file for complete search history.

(56) References Cited

U.S. PATENT DOCUMENTS

| | | | |
|---|---|---|---|
| 2012/0196044 A1* | 8/2012 | Azami | B29B 13/023 427/389.8 |
| 2012/0220932 A1* | 8/2012 | Chen | A61L 29/049 604/96.01 |
| 2012/0328872 A1* | 12/2012 | Ito | B32B 5/024 428/337 |
| 2013/0101824 A1* | 4/2013 | Shim | B29C 70/885 428/221 |
| 2013/0106549 A1* | 5/2013 | Nezu | H01F 5/06 336/96 |
| 2013/0131304 A1* | 5/2013 | Hosoda | C08G 63/605 528/302 |
| 2013/0269304 A1* | 10/2013 | Lee | D04H 1/435 55/528 |
| 2014/0293561 A1* | 10/2014 | Uematsu | H05K 3/427 361/761 |
| 2015/0073068 A1* | 3/2015 | Komatsu | B29B 7/482 523/220 |
| 2015/0353827 A1* | 12/2015 | Hegi | C09K 19/3809 252/299.01 |
| 2016/0133805 A1* | 5/2016 | Park | H01L 33/58 438/15 |
| 2016/0262378 A1* | 9/2016 | Murasugi | A01N 25/00 |
| 2016/0343970 A1* | 11/2016 | Tazaki | H01L 51/524 |
| 2016/0345433 A1* | 11/2016 | Arii | H05K 1/0373 |
| 2017/0075282 A1* | 3/2017 | Higashimura | G03G 15/6517 |
| 2017/0153363 A1* | 6/2017 | Lee | G02B 5/0242 |
| 2018/0116211 A1* | 5/2018 | Murasugi | A01N 25/00 |

* cited by examiner

LAMINATE FILM, METHOD FOR PRODUCING LAMINATE FILM, AND LED-MOUNTED SUBSTRATE

BACKGROUND OF THE INVENTION

Field of the Invention

The present invention relates to a laminate film, a method for producing a laminate film, and a light emitting diode (LED)-mounted substrate.

This application claims priority from Japanese Patent Application No. 2016-081214 filed in Japan on Apr. 14, 2016, the disclosure of which is incorporated herein.

Description of Related Art

There are known chip LED's, in which elements are mounted directly on a pattern of a printed wiring board, and the entirety is sealed with a resin. Since chip LED's are favorable for size reduction and/or thickness reduction of electronic devices, these chip LED's are widely used in electronic equipment such as the lighting for number pads of mobile telephones, and backlight for small-sized liquid crystal displays. As the printed wiring board for conventional chip LED's, a white film formed from a thermosetting resin composition has been used.

In recent years, there has been a noticeable advancement in the technology for increasing luminance of LED's, and thus LED's have gained ever higher luminance. However, as a result, the amount of heat generated in a LED itself has also increased, and the periphery of a printed wiring board may be exposed to high temperature. In such a high temperature environment, there are occasions in which the white film mentioned above undergoes yellowing, and thereby the reflectance is decreased. Accordingly, it has been desired to develop a white film that does not undergo a decrease in reflectance even in a high temperature environment.

PCT International Publication No. WO 2009/069741 discloses a white film formed from a thermoplastic resin composition including a thermoplastic resin with an inorganic filler material incorporated therein. It has been found that the white film disclosed in PCT International Publication No. WO 2009/069741 has an average reflectance of from 73% to 81% in the visible light region at a wavelength in the range of 400 to 800 nm.

PCT International Publication No. WO 2009/069741

SUMMARY OF THE INVENTION

However, the reflectance of the white film disclosed in PCT International Publication No. WO 2009/069741 is decreased by 1% or more in a high temperature environment. Thus, there has been a demand for a film having satisfactory reflectance in the visible light region and having a smaller decrease in reflectance even in a high temperature environment.

This invention was achieved in view of such circumstances, and an object of the present invention is to provide a laminate film having a small decrease in reflectance in the visible light region in a high temperature environment, and a method for producing the laminate film. Furthermore, it is another object of the invention to provide a LED-mounted substrate including such a laminate film.

In an aspect of the invention, there is provided a laminate film including a resin layer having a thickness of from 10 µm to 125 µm; and a toner layer formed on one surface of the resin layer, in which the resin layer has a resin material having a glass transition temperature of 130° C. or higher, and the toner layer has a plurality of voids.

In another aspect of the invention, there is provided a laminate film in which a porosity of the toner layer as calculated in accordance with the following formula (S1) using a void area ratio of a cross section orthogonal to a surface of the toner layer and a void area ratio of a surface, and a porosity of the toner layer as calculated in accordance with the formula (S1) using a void area ratio of a cross section of the toner layer that orthogonally intersects the above-mentioned cross section and is orthogonal to the surface of the toner layer and the void area ratio of the surface, are both from 0.01% to 0.40%.

$$\text{Porosity (\%)} = \frac{\text{Void area ratio of cross section (\%)}}{100} \times \frac{\text{Void area ratio of surface (\%)}}{100} \times 100 \quad (S1)$$

In another aspect of the invention, the laminate film may be configured such that the void area ratio of the surface of the toner layer is from 0.1% to 11%.

In another aspect of the invention, the laminate film may be configured such that the toner layer is a white toner layer.

In another aspect of the invention, the laminate film may be configured such that the resin is a liquid crystal polyester having a structural unit derived from a polyimide or a hydroxycarboxylic acid as a mesogenic group.

In another aspect of the invention, the laminate film may be configured such that the resin is a liquid crystal polyester having a structural unit derived from a hydroxycarboxylic acid as a mesogenic group.

In another aspect of the invention, the laminate film may be configured such that the liquid crystal polyester contains a structural unit derived from 4-hydroxybenzoic acid or 2-hydroxy-6-naphthoic acid.

In another aspect of the invention, the laminate film may be configured such that the liquid crystal polyester has a repeating unit represented by Formula (1), a repeating unit represented by Formula (2), and a repeating unit represented by Formula (3), and the content of repeating units containing a 2,6-naphthylene group is 40 mol % or more with respect to the total mole number of all repeating units.

—O—Ar¹—CO— (1)

—CO—Ar²—CO— (2)

—X—Ar³—Y— (3)

In Formula (1) to Formula (3), $Ar^1$ to $Ar^3$ each independently represent a phenylene group, a naphthylene group, or a biphenylene group; X and Y each independently represent an oxygen atom or an imino group; and one or more hydrogen atoms included in $Ar^1$ to $Ar^3$ may be each independently substituted by a halogen atom, an alkyl group having 1 to 10 carbon atoms, or an aryl group having 6 to 20 carbon atoms.

In another aspect of the invention, the laminate film may be configured such that the repeating unit represented by Formula (1) is a repeating unit represented by Formula (11), the repeating unit represented by Formula (2) is a repeating unit represented by Formula (21), and the repeating unit represented by Formula (3) is a repeating unit represented by Formula (31).

$$—O—Ar^{11}—CO— \quad (11)$$

$$—CO—Ar^{21}—CO— \quad (21)$$

$$—O—Ar^{31}—O— \quad (31)$$

In Formula (11), Formula (21), and Formula (31), $Ar^{11}$, $Ar^{21}$, and $Ar^{31}$ each independently represent a 1,4-phenylene group, a 1,3-phenylene group, a 2,6-naphthylene group, or a 4,4'-biphenylylene group; and one or more hydrogen atoms included in $Ar^{11}$, $Ar^{21}$, and $Ar^{31}$ may be each independently substituted by a halogen atom, an alkyl group having 1 to 10 carbon atoms, or an aryl group having 6 to 20 carbon atoms.

In another aspect of the invention, there is provided a method for producing a laminate film having a resin layer containing a resin material having a glass transition temperature of 130° C. or higher; and a toner layer formed on one surface of the resin layer and having a plurality of voids, the method including a step of forming the toner layer by an electrophotographic method.

In another aspect of the invention, there is provided a LED-mounted substrate including the laminate film described above; a conductor pattern provided on the laminate film; and a LED element connected to the conductor pattern.

That is, the invention has the following aspects:

[1] A laminate film including:
a resin layer having a thickness of from 10 μm to 125 μm; and
a toner layer formed on one surface of the resin layer,
in which the resin layer contains a resin material having a glass transition temperature of 130° C. or higher, and
the toner layer has a plurality of voids.

[2] The laminate film according to [1], in which a porosity of the toner layer as calculated in accordance with the following formula (S1) using a void area ratio of a cross section orthogonal to a surface of the toner layer and a void area ratio of a surface, and a porosity of the toner layer as calculated in accordance with the following formula (S1) using a void area ratio of a cross section orthogonal to both the cross section and the surface of the toner layer and the void area ratio of the surface, are both from 0.01% to 0.40%, $$\text{Porosity (\%)} = \frac{\text{Void area ratio of cross section (\%)}}{100} \times \frac{\text{Void area ratio of surface (\%)}}{100} \times 100 \quad (S1)$$

In the formula (S1), the void area ratio of surface is the percentage of a total area of the voids exposed on a surface of the toner layer relative to an area of the surface, and the void area of cross section is the percentage of a total area of the voids exposed on a cross section of the toner layer relative to an area of the cross section.

[3] The laminate film according to [1] or [2], in which the void area ratio of the surface of the toner layer is from 0.1% to 11%.

[4] The laminate film according to any one of [1] to [3], in which the toner layer is a white toner layer.

[5] The laminate film according to any one of [1] to [4], in which the resin is a liquid crystal polyester having a structural unit derived from a polyimide or a hydroxycarboxylic acid as a mesogenic group.

[6] The laminate film according to any one of [1] to [4], in which the resin is a liquid crystal polyester having a structural unit derived from a hydroxycarboxylic acid as a mesogenic group.

[7] The laminate film according to [5] or [6], in which the liquid crystal polyester contains a structural unit derived from 4-hydroxybenzoic acid or 2-hydroxy-6-naphthoic acid.

[8] The laminate film according to any one of [5] to [7], in which the liquid crystal polyester has a repeating unit represented by Formula (1), a repeating unit represented by Formula (2), and a repeating unit represented by Formula (3), and the content of repeating units containing 2,6-naphthylene groups is 40 mol % or more with respect to the total mole number of all repeating units, $$—O—Ar^{1}—CO— \quad (1)$$

$$—CO—Ar^{2}—CO— \quad (2)$$

$$—X—Ar^{3}—Y— \quad (3)$$

in Formula (1) to Formula (3), $Ar^{1}$ to $Ar^{3}$ each independently represent a phenylene group, a naphthylene group, or a biphenylene group; X and Y each independently represent an oxygen atom or an imino group; and one or more hydrogen atoms included in $Ar^{1}$ to $Ar^{3}$ may be each independently substituted by a halogen atom, an alkyl group having 1 to 10 carbon atoms, or an aryl group having 6 to 20 carbon atoms.

[9] The laminate film according to [8], in which the repeating unit represented by Formula (1) is a repeating unit represented by Formula (11), the repeating unit represented by Formula (2) is a repeating unit represented by Formula (21), and the repeating unit represented by Formula (3) is a repeating unit represented by Formula (31), $$—O—Ar^{11}—CO— \quad (11)$$

$$—CO—Ar^{21}—CO— \quad (21)$$

$$—O—Ar^{31}—O— \quad (31)$$

in Formula (11), Formula (21), and Formula (31), $Ar^{11}$, $Ar^{21}$, and $Ar^{31}$ each independently represent a 1,4-phenylene group, a 1,3-phenylene group, a 2,6-naphthylene group, or a 4,4'-biphenylylene group; and one or more hydrogen atoms included in $Ar^{11}$, $Ar^{21}$, and $Ar^{31}$ may be each independently substituted by a halogen atom, an alkyl group having 1 to 10 carbon atoms, or an aryl group having 6 to 20 carbon atoms.

[10] A method for producing a laminate film having a resin layer containing a resin material having a glass transition temperature of 130° C. or higher; and a toner layer formed on one surface of the resin layer and having a plurality of voids, the method including:
a step of forming the toner layer by an electrophotographic method.

[11] A LED-mounted substrate including:
the laminate film according to any one of [1] to [9];
a conductor pattern provided on the laminate film; and
a LED element connected to the conductor pattern.

[12] A LED-mounted substrate including:
the laminate film according to any one of [1] to [9];
a conductor pattern provided on the laminate film; and
a LED element mounted on the toner layer of the laminate film and connected to the conductor pattern.

According to aspects of the invention, a laminate film having a high reflectance in the visible light region and having a small decrease in reflectance even in a high temperature environment, and a method for producing the laminate film are provided. Also, a LED-mounted substrate including such a laminate film is provided.

DETAILED DESCRIPTION OF THE INVENTION

Hereinafter, embodiments of the laminate film of the present invention will be described. In all of the following drawings, the dimensions, proportions, and the like of each constituent element are varied as appropriate in order to make the drawings easily viewable.

[Laminate Film]

The laminate film of the present embodiment includes a resin layer, and a toner layer formed on one surface of the resin layer.

Figure 1:
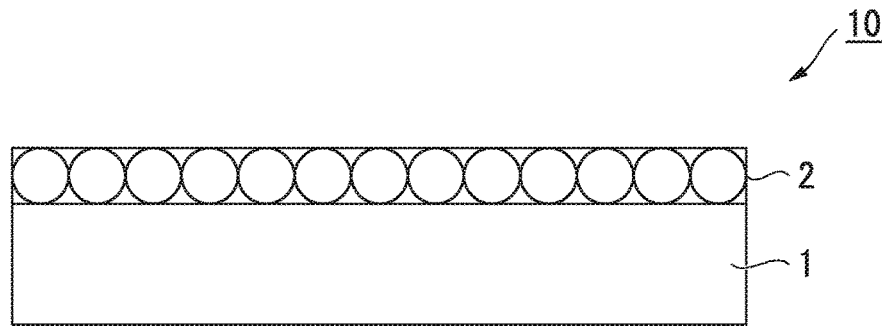
FIG. 1 is a cross-sectional view schematically illustrating a laminate film 10 of the present embodiment.

FIG. 1 is a cross-sectional view schematically illustrating a laminate film 10 of the present embodiment. As illustrated in FIG. 1, the laminate film 10 of the present embodiment includes a resin layer 1, and a toner layer 2 formed on one surface of the resin layer 1.

(Resin Layer)

The thickness of the resin layer 1 is from 10 μm to 125 μm, and preferably from 10 μm to 50 μm. When the thickness of the resin layer 1 is 10 μm or more, sufficient strength of the resin layer 1 itself can be obtained. When the thickness of the resin layer 1 is 125 μm or less, since the resin layer 1 itself has sufficient flexibility, handling is easy. In the present specification, the thickness of the resin layer 1 can be obtained by measuring thickness at any arbitrary nine points of the resin layer using a micrometer, and calculating the average value thereof.

The resin layer 1 contains a resin material having a glass transition temperature of 130° C. or higher.

In another aspect of the invention, it is preferable that the resin layer contains a resin material having a glass transition temperature of from 130° C. to 260° C.

In the invention, the glass transition temperature of the resin layer can be measured by the method described in the following Examples.

Since the resin layer 1 contains a resin material having a sufficiently high glass transition temperature such as 130° C. or higher as described above, even if the toner layer 2 is formed thereon by applying a process requiring a heat treatment at high temperature, such as the electrophotographic method that will be described below, coloration or deterioration of the resin layer 1 can be suppressed. Furthermore, in a case in which the laminate film 10 including the resin layer 1 is applied to a LED-mounted substrate, even if the resin layer 1 is exposed to a high temperature caused by heat generation of the LED itself, coloration or deterioration of the resin layer 1 can be suppressed.

The resin that constitutes the resin layer 1 is preferably, for example, a liquid crystal polyester having a structural unit derived from a polyimide or a hydroxycarboxylic acid as a mesogenic group, and a liquid crystal polyester having a structural unit derived from a hydroxycarboxylic acid as a mesogenic group is more preferred. In the present specification, the term "derived" means that a compound such as the polyimide or the hydroxycarboxylic acid undergoes a change in the chemical structure by polymerization. Here, the mesogenic group is such that the shape of the group included in the liquid crystal molecule is rod-shaped or plate-shaped, and the mesogenic group refers to a group containing a molecular chain having high rigidity along the long chain of the group. In the present embodiment, the mesogenic group may exist in any one or both of the main chain or a side chain of the liquid crystal polyester; however, from the viewpoint that heat resistance of the liquid crystal polyester can be increased, it is preferable that the mesogenic group exist in the main chain.

In the present embodiment, it is preferable that the liquid crystal polyester contains a structural unit derived from 4-hydroxybenzoic acid or 2-hydroxy-6-naphthoic acid.

It is preferable that the liquid crystal polyester of the present embodiment has a repeating unit represented by Formula (1) (hereinafter, may be referred to as "repeating unit (1)"), a repeating unit represented by Formula (2) (hereinafter, may be referred to as "repeating unit (2)"), and a repeating unit represented by Formula (3) (hereinafter, may be referred to as "repeating unit (3)").

—O—Ar$^1$—CO—      (1)

—CO—Ar$^2$—CO—      (2)

—X—Ar$^3$—Y—      (3)

In Formula (1) to Formula (3), Ar$^1$ to Ar$^3$ each independently represent a phenylene group, a naphthylene group, or a biphenylene group; X and Y each independently represent an oxygen atom or an imino group; and one or more hydrogen atoms included in Ar$^1$ to Ar$^3$ may be each independently substituted by a halogen atom, an alkyl group having 1 to 10 carbon atoms, or an aryl group having 6 to 20 carbon atoms.

Examples of the halogen atom include a fluorine atom, a chlorine atom, a bromine atom, and an iodine atom.

Examples of the alkyl group having 1 to 10 carbon atoms include a methyl group, an ethyl group, a n-propyl group, an isopropyl group, a n-butyl group, an isobutyl group, a sec-butyl group, a tert-butyl group, a n-hexyl group, a 2-ethylhexyl group, a n-octyl group, or a n-decyl group.

Examples of the aryl group having 6 to 20 carbon atoms include a phenyl group, an o-tolyl group, a m-tolyl group, a p-tolyl group, a 1-naphthyl group, or a 2-naphthyl group.

In the case in which the hydrogen atoms are substituted by these groups, the number of substitutions is preferably 2 or less, and more preferably 1, independently for each of the groups represented by Ar$^1$ to Ar$^3$ (a phenylene group, a naphthylene group, or a biphenylene group).

Furthermore, from the viewpoint of enhancing heat resistance of the liquid crystal polyester or obtaining easy moldability, it is more preferable that the repeating unit (1) is a repeating unit represented by Formula (11), the repeating unit (2) is a repeating unit represented by Formula (21), and the repeating unit (3) is a repeating unit represented by Formula (31).

—O—Ar$^{11}$—CO—      (11)

—CO—Ar$^{21}$—CO—      (21)

—O—Ar$^{31}$—O—      (31)

In Formula (11), Formula (21), and Formula (31), Ar$^{11}$, Ar$^{21}$ and Ar$^{31}$ each independently represent a 1,4-phenylene group, a 1,3-phenylene group, a 2,6-naphthylene group, and a 4,4'-biphenylylene group. One or more hydrogen atoms included in Ar$^{11}$, Ar$^{21}$, and Ar$^{31}$ may be each independently substituted by a halogen atom, an alkyl group having 1 to 10 carbon atoms, or an aryl group having 6 to 20 carbon atoms.

The halogen atom, the alkyl group having 1 to 10 carbon atoms, and the aryl group having 6 to 20 carbon atoms are the same as described in connection with Formulae (1) to (3).

The repeating unit (11) is preferably a repeating unit derived from the following aromatic hydroxycarboxylic acid.

Regarding the repeating unit (11), it is preferable that $Ar^{11}$ represents a 1,4-phenylene group, that is, the repeating unit (1) is a repeating unit derived from 4-hydroxybenzoic acid.

Regarding the repeating unit (11), it is preferable that $Ar^{11}$ represents a 1,3-phenylene group, that is, the repeating unit (11) is a repeating unit derived from 3-hydroxybenzoic acid.

Regarding the repeating unit (1), it is preferable that $Ar^{11}$ represents a 2,6-naphthylene group, that is, the repeating unit (11) is a repeating unit derived from 2-hydroxy-6-naphthoic acid.

Regarding the repeating unit (11), it is preferable that $Ar^{11}$ represents a 4,4'-biphenylylene group, that is, the repeating unit (11) is a repeating unit derived from 4-(4-hydroxyphenyl)benzoic acid.

The repeating unit (21) is preferably a repeating unit derived from the following aromatic dicarboxylic acid.

Regarding the repeating unit (21), it is preferable that $Ar^{21}$ represents a 1,4-phenylene group, that is, the repeating unit (21) is a repeating unit derived from terephthalic acid.

Regarding the repeating unit (21), it is preferable that $Ar^{21}$ represents a 1,3-phenylene group, that is, the repeating unit (21) is a repeating unit derived from isophthalic acid.

Regarding the repeating unit (21), it is preferable that $Ar^{21}$ represents a 2,6-naphthylene group, that is, the repeating unit (21) is a repeating unit derived from 2,6-naphthalenedicarboxylic acid.

Regarding the repeating unit (21), it is preferable that $Ar^{21}$ represents a 4,4'-biphenylylene group, that is, the repeating unit (21) is a repeating unit derived from 4,4'-biphenyldicarboxylic acid.

The repeating unit (31) is preferably a repeating unit derived from the following aromatic diol.

Regarding the repeating unit (31), it is preferable that $Ar^{31}$ represents a 1,4-phenylene group, that is, the repeating unit (31) is a repeating unit derived from 1,4-benzenediol.

Regarding the repeating unit (31), it is preferable that $Ar^{31}$ represents a 1,3-phenylene group, that is, the repeating unit (31) is a repeating unit derived from 1,3-benzenediol.

Regarding the repeating unit (31), it is preferable that $Ar^{31}$ represents a 2,6-naphthylene group, that is, the repeating unit (31) is a repeating unit derived from 2,6-naphthalenediol.

Regarding the repeating unit (31), it is preferable that $Ar^{31}$ represents a 4,4'-biphenylylene group, that is, the repeating unit (31) is a repeating unit derived from biphenyl-4,4'-diol.

As described above, one or more hydrogen atoms of a benzene ring or a naphthalene ring of these compounds may be each independently substituted by a halogen atom, an alkyl group having 1 to 10 carbon atoms, or an aryl group having 6 to 20 carbon atoms.

In regard to the liquid crystal polyester of the present embodiment, the content of a repeating unit containing a 2,6-naphthylene group is preferably 40 mol % or more, more preferably 50 mol % or more, even more preferably 60 mol % or more, and particularly preferably 70 mol % or more, with respect to the total mole number of all repeating units.

In another aspect of the invention, in regard to the liquid crystal polyester of the present embodiment, the content of repeating units containing a 2,6-naphthylene group is preferably from 40 mol % to 95 mol %, more preferably from 50 mol % to 90 mol %, even more preferably from 60 mol % to 85 mol %, and particularly preferably from 70 mol % to 80 mol %, with respect to the total mole number of all repeating units.

Here, the total mole number of all repeating units refers to a value obtained by dividing the total mass of each repeating unit in the liquid crystal polyester by the formula weight of each repeating unit, thereby determining the amount (mol) equivalent to the amount of substance of each repeating unit, and summing the amounts of all the repeating units.

The content of the repeating unit (1) is preferably from 30 mol % to 80 mol %, more preferably from 40 mol % to 70 mol %, and even more preferably from 45 mol % to 65 mol %, with respect to the total mole number of all the repeating units.

The content of the repeating unit (2) is preferably from 10 mol % to 35 mol %, 5 more preferably from 15 mol % to 30 mol %, and even more preferably from 17.5 mol % to 27.5 mol %, with respect to the total mole number of all the repeating units.

The content of the repeating unit (3) is preferably from 10 mol % to 35 mol %, more preferably from 15 mol % to 30 mol %, and even more preferably from 17.5 mol % to 27.5 mol %, with respect to the total mole number of all the repeating units.

The liquid crystal polyester of the present embodiment is configured to include various repeating units such that the total mole number of all the repeating units is 100 mol %, as described above. That is, the total mole number of all repeating units means the total mole number of a repeating unit (1), a repeating unit (2), a repeating unit (3), and all the repeating units other than the repeating units (1) to (3) in the liquid crystal polyester. A liquid crystal polyester having such a predetermined repeating unit composition has excellent heat resistance and is easily moldable. It is preferable that the content of the repeating unit (2) and the content of the repeating unit (3) are substantially the same. That is, the ratio represented by [content of repeating unit (2)]/[content of repeating unit (3)] is preferably 0.8 to 1.2, and more preferably 0.9 to 1.1. The liquid crystal polyester may have a repeating unit other than the repeating units (1) to (3), to the extent that the effects of the invention are not impaired. The content of the repeating unit other than the repeating units (1) to (3) is preferably 10 mol % or less, and more preferably 5 mol % or less, with respect to the total mole number of all the repeating units.

A representative example of a liquid crystal polyester that has excellent heat resistance and is easily moldable may be a liquid crystal polyester having the following repeating unit composition. For example, the liquid crystal polyester has a repeating unit (1) in which $Ar^1$ represents a 2,6-naphthylene group, that is, a repeating unit derived from 2-hydroxy-6-naphthoic acid, in an amount of preferably from 40 mol % to 74.8 mol %, more preferably from 40 mol % to 64.5 mol %, and even more preferably from 50 mol % to 58 mol %, with respect to the total mole number of all the repeating units in the liquid crystal polyester.

At the same time, the liquid crystal polyester has a repeating unit (2) in which $Ar^2$ represents a 2,6-naphthylene group, that is, a repeating unit derived from 2,6-naphthalenedicarboxylic acid, in an amount of preferably from 12.5 mol % to 30 mol %, more preferably from 17.5 mol % to 30 mol %, and even more preferably from 20 mol % to 25 mol %.

Also, at the same time, the liquid crystal polyester has a repeating unit (2) in which $Ar^2$ represents a 1,4-phenylene group, that is, a repeating unit derived from terephthalic acid, in an amount of preferably from 0.2 mol % to 15 mol %, more preferably from 0.5 mol % to 12 mol %, and even more preferably from 2 mol % to 10 mol %, with respect to the total mole number of all the repeating units in the liquid crystal polyester.

Furthermore, at the same time, the liquid crystal polyester has a repeating unit (3) in which $Ar^3$ represents a 1,4-phenylene group, that is, a repeating unit derived from 1,4-benzenediol, in an amount of preferably from 12.5 mol % to 30 mol %, more preferably from 17.5 mol % to 30 mol %, and even more preferably from 20 mol % to 25 mol %, with respect to the total mole number of all the repeating units in the liquid crystal polyester.

Also, at the same time, the content of a repeating unit (2) in which $Ar^2$ represents a 2,6-naphthylene group is preferably 0.5 times or more, and more preferably 0.6 times or more, with respect to the total content of a repeating unit (2) in which $Ar^2$ represents a 2,6-naphthylene group and a repeating unit (2) in which $Ar^2$ represents a 1,4-phenylene group.

That is, it is preferable that the content of a repeating unit (2) in which $Ar^2$ represents a 2,6-naphthylene group is 50 mol % or more, and more preferably 60 mol % or more, with respect to the total number of contained moles of a repeating unit (2) in which $Ar^2$ represents a 2,6-naphthylene group and a repeating unit (2) in which $Ar^2$ represents a 1,4-phenylene group.

The flow starting temperature of the liquid crystal polyester is preferably 280° C. or higher, more preferably 290° C. or higher, and even more preferably 295° C. or higher. The flow starting temperature of the liquid crystal polyester is preferably 380° C. or lower, and more preferably 350° C. or lower. When the flow starting temperature of the liquid crystal polyester is 280° C. or higher, heat resistance and melt tension can be sufficiently enhanced. When the flow starting temperature of the liquid crystal polyester is 380° C. or lower, melting of the liquid crystal polyester does not require a high temperature, and the liquid crystal polyester is not easily thermally degraded during molding.

That is, the flow starting temperature of the liquid crystal polyester is preferably from 280° C. to 380° C., more preferably from 290° C. to 360° C., even more preferably from 290° C. to 350° C., and particularly preferably from 295° C. to 340° C.

Here, the flow starting temperature is also called flow temperature or fluid temperature, and this serves as a reference for the molecular weight of a liquid crystal polyester. The flow starting temperature represents a temperature at which the melt viscosity is 4,800 Pa·s (48,000 poises) when a heated molten body of a liquid crystal polyester is extruded through a nozzle using a capillary rheometer having a nozzle with an inner diameter of 1 mm and a length of 10 mm, under a load of 9.8 MPa (100 kg/cm$^2$) at a rate of temperature increase of 4° C./min.

It is preferable that the resin layer 1 includes a resin composition containing the above-mentioned resin with a filler material and the like incorporated therein.

Examples of the filler material include glass fibers such as milled glass fibers and chopped glass fibers; metallic or non-metallic whiskers such as potassium titanate whiskers, alumina whiskers, aluminum borate whiskers, silicon carbide whiskers, and silicon nitride whiskers; glass beads, hollow glass spheres, glass powder, mica, talc, clay, silica, alumina, potassium titanate, wollastonite, calcium carbonate (heavy, light, colloidal or the like), magnesium carbonate, basic magnesium carbonate, sodium sulfate, calcium sulfate, barium sulfate, calcium sulfite, aluminum hydroxide, magnesium hydroxide, calcium hydroxide, calcium silicate, silica sand, silica stone, quartz, titanium oxide, zinc oxide, iron oxide, graphite, molybdenum, asbestos, silica alumina fibers, alumina fibers, gypsum fibers, carbon fibers, carbon black, white carbon, diatomaceous earth, bentonite, sericite, shirasu, and plumbago.

Among these, silica, alumina, and titanium oxide are preferably used. In a case in which a liquid crystal polyester is used as the resin, when a filler, and preferably an inorganic filler, is incorporated into the liquid crystal polyester, the melt viscosity of the resulting liquid crystal polyester composition can be lowered, and extrusion molding at low temperature is enabled.

These filler materials may be used singly, or an arbitrary combination of two or more kinds thereof may be used together.

These filler materials may be surface-treated as necessary. Examples of a surface treating agent include reactive coupling agents such as a silane-based coupling agent, a titanate-based coupling agent, and a borane-based coupling agent; and lubricating agents such as a higher fatty acid, a higher fatty acid ester, a higher fatty acid metal salt, and a fluorocarbon-based surfactant.

In the invention, the volume average particle size of the filler material is preferably from 0.05 μm to 0.50 μm, and more preferably from 0.10 μm to 0.30 μm.

For example, the particle size of the filler material can be measured by a laser diffraction scattering method according to JIS R1629, and the volume average of the particle size distribution can be designated as the volume average particle size.

The amount of incorporation of the filler material is preferably from 0.1 parts by mass to 20 parts by mass, more preferably from 0.5 parts by mass to 15 parts by mass, and even more preferably from 0.5 parts by mass to 10 parts by mass, with respect to 100 parts by mass of the resin. When the content of the filler material is smaller than 0.1 parts by mass, it is difficult to decrease the melt viscosity of the liquid crystal polyester composition, and if the content is larger than 20 parts by mass, the melt tension of the liquid crystal polyester composition may become insufficient.

That is, when the amount of incorporation of the filler material with respect to 100 parts by mass of the resin is 0.1 parts by mass or more, the melt viscosity of the liquid crystal polyester composition decreases, and when the amount of incorporation is 20 parts by mass or less, sufficient melt tension of the liquid crystal polyester composition is obtained.

The resin composition may also include a thermoplastic resin other than the resin described above, or additives, in addition to the filler. The proportion of the above-mentioned resin in the total amount of the resin composition is preferably 80% by mass or more, and more preferably 90% by mass or more.

In another aspect of the invention, the proportion of the resin is preferably from 80% by mass to 97% by mass, and more preferably from 90% by mass to 95% by mass.

Examples of the thermoplastic resin other than the resin mentioned above include polycarbonate, polysulfone, polyphenylene ether, polyether ketone, and polyether imide.

Examples of the additives include a fluororesin, a mold release improving agent such as a metal soaps, a nucleating agent, an antioxidant, a stabilizer, a sliding agent, a coloration inhibitor, an ultraviolet absorber, a lubricating agent, and a flame retardant.

(Toner Layer)

The toner layer 2 illustrated in FIG. 1 is formed from a toner that is used for conventionally known electrophotographic methods. The toner layer 2 has a plurality of voids at the surface and in the interior. It is preferable that a porosity of the toner layer 2 as calculated in accordance with the following formula (S1) using a void area ratio of a cross section orthogonal to a surface of the toner layer 2 and a void area ratio of a surface of the toner layer 2, and a porosity of the toner layer 2 as calculated in accordance with the formula (S1) using a void area ratio of a cross section orthogonal to both the cross section and the surface of the toner layer 2 and the void area ratio of the surface, are both from 0.01% to 0.40%.

$$\text{Porosity (\%)} = \frac{\text{Void area ratio of cross section (\%)}}{100} \times \frac{\text{Void area ratio of surface (\%)}}{100} \times 100 \quad (S1)$$

In another aspect of the invention, there is provided a laminate film including a resin layer having a thickness of from 10 μm to 125 μm; and a toner layer formed on one surface of the resin layer, in which the resin layer containing a resin material having a glass transition temperature of 130° C. or higher, and the toner layer having a plurality of voids, in which a porosity of the toner layer as calculated in accordance with the formula (S1) using a void area ratio of a cross section orthogonal to a surface of the toner layer and a void area ratio of a surface, and a porosity of the toner layer as calculated in accordance with the formula (S1) using a void area ratio of a cross section orthogonal to orthogonal to both the cross section and the surface of the toner layer and the void area ratio of the surface, are both from 0.01% to 0.70%.

Here, the "surface of the toner layer" means a surface facing the surface of the toner layer that is in contact with the surface of the resin layer. The "void area ratio of the surface of the toner layer" means the proportion of the area of voids exposed to the surface with respect to the area of the surface of the toner layer 2, and the "void area ratio of a cross section of the toner layer" means the proportion of the area of voids exposed to the cross section with respect to the area of the cross section of the toner layer 2.

This void area ratio of the surface and the void area ratio of the cross section can be determined by the following method. The void area ratio of the surface and the void area ratio of the cross section can be determined by subjecting in the surface and the cross section of the toner layer 2 to binary image processing by a known image analyzing device. Here, binary image processing refers to a processing of converting an image with shades of gray to two tones of white and black. In the invention, voids at the surface and the cross section are indicated in, for example, black color. Specifically, the void area ratio of the surface and the void area ratios of the respective cross sections in two orthogonally intersecting directions are calculated from two-dimensional images obtained by a known image analyzing device. In regard to this measurement, the void area ratio is a value, expressed in percentage, of the proportion of the area of voids in a measurement area (usually, about 0.2 to 0.7 mm²) for the known image analyzing device. That is, the void area ratio of the invention is a value, expressed in percentage, represented by the proportion of voids in a unit area with respect to the unit area. As an example of a known image analyzing device, "LUZEX (registered trademark)" manufactured by Nireco Corporation may be mentioned.

The void area ratio of a cross section orthogonal to the surface of the toner layer can be determined by subjecting a cross section obtainable by cutting the toner layer orthogonally from the surface in the thickness direction using a cutting means such as a cutter knife, to image processing by an image analyzing device. The void area ratio of a cross section that orthogonally intersects the above-mentioned cross section and is orthogonal to the surface of the toner layer can be determined by subjecting a cross section obtainable by cutting the toner layer orthogonally from the surface in a direction orthogonally intersecting the above-mentioned cross section and in the thickness direction of the toner layer using a cutting means such as a cutter knife, to image processing by means an image analyzing device. A specific example of the combination of such two cross sections may be a cross section obtainable by cutting the toner layer orthogonally from the surface in the thickness direction of the toner layer along the direction of coating of toner determined at the time of forming the toner layer (hereinafter, may be referred to as MD), by means of a cutting means; and a cross section obtainable by cutting the toner layer orthogonally from the surface in the thickness direction of the toner layer along a direction that is orthogonal to the MD (hereinafter, may be referred to as TD) using a cutting means. As long as the two cross sections are in a relation of orthogonally intersecting each other, any place of the toner layer may be cut. The cross sections may be subjected to binary image processing, if necessary, after being polished.

Since light in the visible light region is reflected in the vicinity of the surface of the toner layer 2, the contribution of the void area ratio of the surface of the toner layer 2 to the reflectance in the visible light region is large. The void area ratio of the surface of the toner layer is preferably from 0.1% to 11%. When the void area ratio of the surface of the toner layer 2 is in the range described above, the reflectance in the visible light region can be made sufficiently high.

In another aspect of the invention, the void area ratio of the surface of the toner layer 2 is preferably from 0.1% to 5.0%.

The average particle size of the toner for forming the toner layer 2 is preferably from 3 μm to 15 μm, from the viewpoint that the porosity and the void area ratio of the surface of toner layer 2 can be easily controlled to the ranges described above. The average particle size of the toner described above, for example, can be measured by electrical sensing zone method.

The thickness of the toner layer 2 is from 5 μm to 50 μm, and preferably from 10 μm to 30 μm. When the thickness of the toner layer 2 is in the range described above, the reflectance in the visible light region can be made sufficiently high. The average particle size of the above-mentioned toner can be appropriately determined according to the desired thickness of the toner layer 2.

In a case in which the laminate film 10 of the present embodiment is applied to a printed wiring board of a LED, the toner layer 2 is preferably a white toner layer.

Generally, a toner used in an electrophotographic method includes a binder resin, a colorant, a wax, and a charge control agent. In the present embodiment, a toner that is used in electrophotographic methods is usually used.

Regarding an example of the binder resin, any resin that is used in electrophotographic methods can be used, for example, a polyester resin and a styrene-(meth)acrylic acid ester copolymer may be mentioned.

For example, a polyester resin obtained by dehydration condensation of a polyvalent carboxylic acid and a polyhydric alcohol is suitable.

Examples of the polyvalent carboxylic acid include aromatic carboxylic acids such as terephthalic acid, isophthalic acid, phthalic acid, trimellitic acid, pyromellitic acid, and naphthalenedicarboxylic acid; aliphatic carboxylic acids such as maleic acid, fumaric acid, succinic acid, and adipic acid; and alicyclic carboxylic acids such as cyclohexanedicarboxylic acid. Anhydrides and lower alkyl esters of these carboxylic acids can be used. Among these, an aromatic carboxylic acid, an anhydride thereof, or a lower alkyl ester thereof is suitable.

These polyvalent carboxylic acids may be used singly, or an arbitrary combination of two or more kinds thereof may be used together.

Examples of the polyhydric alcohol include aliphatic diols such as ethylene glycol, diethylene glycol, triethylene glycol, propylene glycol, butanediol, hexanediol, neopentyl glycol, glycerin, trimethylolpropane, and pentaerythritol; alicyclic diols such as cyclohexanediol, cyclohexanedimethanol, and hydrogenated bisphenol A; and aromatic diols such as ethylene oxide adduct of bisphenol A and propylene oxide adduct of bisphenol A.

These polyhydric alcohols may be used singly, or an arbitrary combination of two or more kinds thereof may be used together.

At least one compound selected from a monocarboxylic acid, an anhydride or ester thereof, a monoalcohol, and the like may be added to a polyester resin obtained by dehydration condensation between a polyvalent carboxylic acid and a polyhydric alcohol. In this manner, any one or both of a hydroxyl group or a carboxyl group at a polymer terminal can be esterified, and thereby the acid value of the polyester resin can be adjusted.

It is preferable that the colorant is a white pigment. Examples of the white pigment include white pigments conventionally used in electrophotographic methods, for example, titanium oxide, barium sulfate, aluminum oxide, calcium carbonate, zinc oxide, and silicon oxide. A preferred example of the white pigment is titanium oxide.

Examples of the wax include waxes used in electrophotographic methods, for example, vegetable waxes such as carnauba wax, rice wax, and candelilla wax; petroleum waxes such as paraffin wax and microcrystalline wax; mineral waxes such as montan wax; synthetic waxes such as carbowax, polyethylene wax, polypropylene wax, and chlorinated naphthalene wax; higher fatty acids such as stearic acid, arachidic acid, and behenic acid; higher alcohols such as ceryl alcohol and melissyl alcohol; amide-based waxes such as stearic acid amide and behenic acid amide; polyhydric alcohol esters such as fatty acid esters, glycerin monostearate, and glycerin distearate; and silicone varnish.

These waxes may be used singly, or an arbitrary combination of two or more kinds thereof may be used together.

Charge control agents are classified into charge control agents that control a toner to be negatively chargeable, and charge control agents that control a toner to be positively chargeable. Examples of the charge control agents that control a toner to be negatively chargeable include a monoazo metal compound, an acetylacetone metal compound, an aromatic hydroxycarboxylic acid, a metal-containing salicylic acid-based compound, a boron complex compound, and a calixarene. Examples of the charge control agents that control a toner to be positively chargeable include tributylbenzylammonium-1-hydroxy-4-naphtholsulfonic acid salt, nigrosin, a guanidine compound, a triphenylmethane dye, and a quaternary ammonium salt. Among these, from the viewpoint of not affecting the color tone or reflectance of the toner layer thus obtainable, a colorless, white, or pale-colored charge control agent is suitable.

In a case in which the laminate film 10 of the present embodiment is applied to a LED-mounted substrate, the layer on the side where a LED is mounted is formed from a toner that is used in a process requiring a heat treatment at a high temperature, such as an electrophotographic method. Therefore, even if the laminate film is exposed to a higher temperature by the heat generation of the LED itself, coloration, deterioration, or the like of the laminate film can be suppressed. That is, a laminate film which undergoes a small decrease in reflectance even in a high temperature environment can be obtained.

The toner that constitutes the toner layer 2 may further include other components that are used in electrophotographic methods, as long as the other components do not affect the color tone or reflectance of the toner layer.

[Method for Producing Laminate Film]

Next, an embodiment of the method for producing a laminate film according to the invention will be explained. In the following description, a liquid crystal polyester will be explained as an example of the layer-forming material of the resin layer 1; however, the present embodiment is not intended to be limited to this.

The laminate film 10 of the present embodiment is obtained by forming a toner layer 2 on one surface of a resin layer 1 by an electrophotographic method that will be described below.

The resin layer 1 is obtained by molding a liquid crystal polyester or a resin composition including a liquid crystal polyester into a film form.

Regarding the liquid crystal polyester, a commercially available product may be used, or a product synthesized by a conventionally known synthesis method may be used. In a case in which a synthesized liquid crystal polyester is used, a liquid crystal polyester can be produced by mixing a monomer that gives the repeating unit (1), that is, a predetermined aromatic hydroxycarboxylic acid; a monomer that gives the repeating unit (2), that is, a predetermined aromatic dicarboxylic acid; and a monomer that gives the repeating unit (3), that is, a predetermined aromatic diol, at a predetermined concentration, and melt polymerizing the monomers.

Here, the predetermined concentration is such that the total mole number of monomers having a 2,6-naphthylene group, that is, the total mole number of 2-hydroxy-6-naphthoic acid, 2,6-naphthalenedicarboxylic acid, and 2,6-naphthalenediol, is 40 mol % or more with respect to the total mole number of all the monomers.

In regard to the production of the liquid crystal polyester, instead of a portion or the entirety of each of the aromatic hydroxycarboxylic acid, aromatic dicarboxylic acid, and aromatic diol, polymerizable derivatives thereof may also be used.

Examples of a polymerizable derivative of a compound having a carboxyl group, such as an aromatic hydroxycarboxylic acid and an aromatic dicarboxylic acid, include a derivative obtainable by converting a carboxyl group into an alkoxycarbonyl group or an aryloxycarbonyl group, a derivative obtainable by converting a carboxyl group into a haloformyl group, and a derivative obtainable by converting a carboxyl group into an acyloxycarbonyl group.

Examples of a polymerizable derivative of a compound having a hydroxyl group, such as an aromatic diol, include a derivative obtainable by converting a hydroxyl group into an acyloxyl group through acylation.

Examples of the method for molding the resin layer 1 include an extrusion molding method, a press molding method, a solution flow casting method, and an injection molding method, and a preferred method may be an extrusion molding method. Examples of the extrusion molding method include a T-die method and an inflation method, and a preferred method may be a T-die method. The T-die method involves uniaxial stretching or biaxial stretching.

The T-die method can be carried out by extruding a molten resin obtained by melting a resin composition including the liquid crystal polyester into a thin film form through a slit of a T-shaped die, and molding the resin.

The inflation method can be carried out by extruding a molten resin obtained by melting a resin composition including the polyester into a cylindrical shape through a ring-shaped nozzle, causing the molten resin to expand by blowing air into the cylinder, and adjusting the film thickness.

Using above-described molding methods, pellets are produced by melt kneading above-described resin composition and filler at a temperature ranging from a temperature lower by 10° C. than the flow starting temperature of the liquid crystal polyester thus obtained, to a temperature higher by 100° C. than the flow starting temperature. From the viewpoint of suppressing thermal deterioration of the liquid crystal polyester, pellets are produced preferably at a temperature ranging from a temperature lower by 10° C. than the flow starting temperature to a temperature higher by 70° C. than the flow starting temperature; and more preferably a temperature ranging from a temperature lower by 10° C. than the flow starting temperature to a temperature higher by 50° C. than the flow starting temperature.

Using above-described molding method, the resin layer 1 is produced by melt kneading the pellets at a temperature ranging from a temperature lower by 10° C. than the flow starting temperature of the liquid crystal polymer to a temperature higher by 100° C. than the flow starting temperature. The preferred temperature for melt kneading is the same as described in connection with the producing pellets.

The stretch ratio of uniaxial stretching in the T-die method is preferably from 1.1 times to 40 times, more preferably from 10 times to 40 times, and even more preferably from 15 times to 35 times. The stretch ratio in the machine direction (MD) (direction of extrusion) of biaxial stretching in the T-die method is preferably from 1.2 times to 40 times. The stretch ratio in the transverse direction (TD) (direction orthogonal to the direction of extrusion) of biaxial stretching in the T-die method is from 1.2 times to 20 times.

The stretch ratio in the MD in an inflation method is preferably from 1.5 times to 50 times, and more preferably from 5 times to 30 times. The stretch ratio in the TD in an inflation method is preferably from 1.5 times to 10 times, and more preferably from 2 times to 5 times.

Next, the toner layer 2 is formed on one surface of the resin layer 1 thus obtained, by an electrophotographic method. Generally, an electrophotographic method includes five steps of charging, exposure, developing, transfer, and fixing. Specifically, first, uniform electric charge is applied to the surface of a photoreceptor by corona discharge (charging step). Next, an electrostatic image is formed by light irradiation (exposure step). The electrostatic image thus obtained is subjected to color developing by means of a toner (developing step). The electrostatic image that has been subjected to color developing is transferred to one surface of the resin layer 1 (transfer step). The electrostatic image thus transferred is fixed by heating, pressure, solvent vapor, or the like, and thus the toner layer 2 is formed (fixing step).

When the electrophotographic printer of the Examples that will be described below is used, a desired electrostatic image can be formed on the surface of a photoreceptor in the exposure step. The electrostatic image can be exposed by performing light irradiation over the entire surface of the photoreceptor.

In an aspect of the invention, there is provided a method for producing a laminate film including a resin layer containing a resin material having a glass transition temperature of 130° C. or higher; and a toner layer formed on one surface of the resin layer and having a plurality of voids, the method including an charging step of performing corona discharge and applying uniform electric charge to the surface of a photoreceptor; an exposure step of performing light irradiation on the surface of the photoreceptor and forming an electrostatic image; a developing step of attaching toner to the electrostatic image on the surface of the photoreceptor; a transfer step of transferring the toner-attached electrostatic image onto one surface of the resin layer; and a fixing step of treating the transferred electrostatic image with heating, pressure or solvent vapor, and fixing the electrostatic image to the resin layer, characterized in that the toner layer is formed on one surface of the resin layer.

The porosity of the toner layer 2 and the void area ratio of the surface are affected by the molten state of the toner. As the toner is in a thoroughly molten state, the porosity of the toner layer 2 and the void area ratio of the surface are decreased. Therefore, the porosity of the toner layer 2 and the void area ratio of the surface can be controlled by controlling the molten state of the toner.

The molten state of the toner varies depending on the conditions for the fixing step, physical properties of the toner, thickness of the resin layer 1, and the ambient temperature during fixing.

The conditions for the fixing step include the heating temperature or pressure for the toner, the number of times of formation of the toner layer 2, the heating time for the toner, the amount of toner per unit area of the resin layer 1, and the like. Here, the number of times of formation of the toner layer 2 corresponds to the number of times of repeatedly performing the above-described five steps as one cycle. The heating time corresponds to the time required until the toner passes through a fixing apparatus that is used in the fixing step.

As the heating temperature or pressure for the toner is increased, it is easier to melt the toner. As the heating time for the toner is longer, it is easier to melt the toner. Furthermore, as the amount of toner per unit area of the resin layer 1 is larger, it is easier for the voids between adjacent toner particles to be filled when the toner is melted. Therefore, the porosity and the void area ratio of the surface of the toner layer 2 are reduced.

Examples of the physical properties of a toner include the thermal characteristics such as glass transition temperature and viscoelasticity of the toner, and the molecular weight distribution of the toner. As the glass transition temperature and viscoelasticity of the toner are lower, it is easier to melt the toner, and the porosity of the toner layer 2 and the void area ratio of the surface become lower. As the molecular weight distribution of the toner is larger, it is easier to melt the toner, and the porosity of the toner layer 2 and the void area ratio of the surface become lower.

As the thickness of the resin layer 1 is larger, heat cannot easily escape during fixing. Therefore, it is easier to melt the toner, and the porosity of the toner layer 2 and the void area ratio of the surface become lower.

As the ambient temperature at during fixing is higher, the temperature of the resin layer 1 also becomes higher, and heat cannot easily escape during fixing. Therefore, it is easier to melt the toner, and the porosity and the void area ratio of the surface of the toner layer 2 become lower.

The heating temperature for the fixing step can be appropriately determined based on the viscoelasticity of the toner, heating time, and the layer-forming material or thickness of the resin layer 1, and for example, the heating temperature is preferably from 120° C. to 200° C.

When an electrophotographic method is used for the formation of the toner layer 2, a toner layer 2 having a desired shape can be easily formed at a desired position. For example, in a case in which the laminate film is applied to a LED-mounted substrate, since the toner layer 2 can be selectively and easily formed at a site where it is wished to mount a LED element on the resin layer 1, excellent processability and handleability are obtained. Furthermore, a plurality of regions having mutually different reflectances in the visible light region can be easily formed on the resin layer 1, by appropriately setting the conditions for the each step of the electrophotographic method.

When a laminate film having such a configuration as described above is used, a laminate film having a high reflectance in the visible light region and having a small decrease in reflectance even in a high temperature environment is obtained.

When a method for producing a laminate film based on the method described above is employed, a laminate film having a high reflectance in the visible light region and having a small decrease in reflectance even in a high temperature environment is obtained.

[LED-Mounted Substrate]

Figure 2:
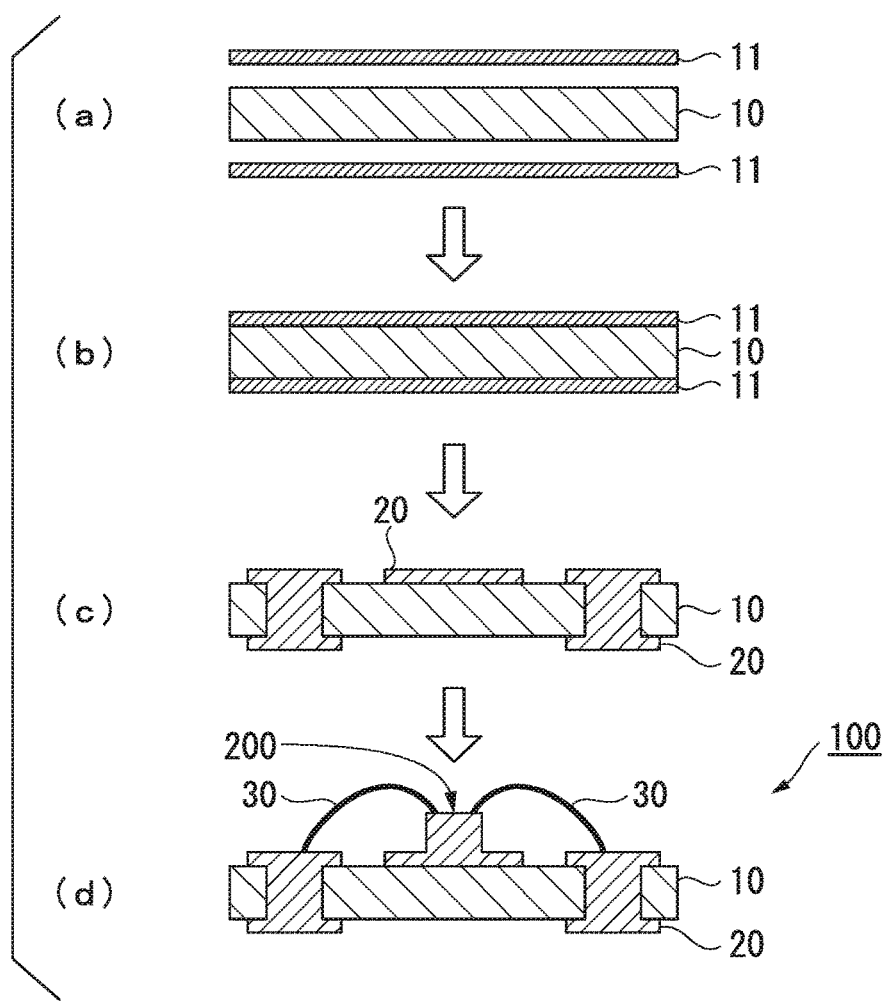
FIG. 2 shows cross-sectional views schematically illustrating a LED-mounted substrate 100 of the present embodiment, and a process flow chart illustrating the method for producing the LED-mounted substrate 100.

In the following description, an embodiment of the LED-mounted substrate of the invention will be explained. FIG. 2(a) to 2(d) present cross-sectional views schematically illustrating a LED-mounted substrate 100 of the present embodiment, and a process flow chart illustrating the method for producing the LED-mounted substrate. As illustrated in FIG. 2, the LED-mounted substrate 100 includes the laminate film 10 described above; a conductor pattern 20 provided on the laminate film 10; bonding wires 30; and a LED (LED element) 200 connected to the conductor pattern 20.

The LED-mounted substrate 100 of the present embodiment can be produced by the method illustrated in FIG. 2. As illustrated in FIG. 2, (a) a laminate film 10 and metal layers 11 are prepared; and (b) the metal layers 11 are laminated on both surfaces of the laminate film 10 by vacuum pressing or the like. Examples of the layer-forming material of the metal layer 11 include copper, gold, silver, aluminum, nickel, and tin, and a preferred material is copper.

Next, (c) the metal layers 11 are etched, or a pattern is directly formed on the metal layers 11, to thereby form a conductor pattern 20, and thus a substrate for LED mounting is obtained. (d) On this substrate, a LED 200 is mounted and is connected to the conductor pattern 20 by bonding wires 30, and thus a LED-mounted substrate 100 is obtained. The above-mentioned layer-forming material for the metal layer 11 can be used as the material for forming the conductor pattern 20.

When a LED-mounted substrate having such a configuration as described above is used, since the LED-mounted substrate includes the laminate film explained above, it is not necessary to lower the luminance of the LED to be mounted in order to suppress deterioration of the laminate film. Accordingly, the LED equipped with such a LED-mounted substrate has superior brightness.

Thus, suitable embodiments related to the invention have been explained with reference to the attached drawings; however, the invention is not intended to be limited to the relevant embodiments. The several shapes, combinations, and the like of the each constituent member described in the above-mentioned embodiments are examples taken only for illustrative purposes, and various modifications can be made based on the design-related requirements and the like, as long as the gist of the invention is maintained.

EXAMPLES

In the following description, the invention will be explained by way of Examples. For the liquid crystal polyester composition and the laminate film, various measurements and evaluations were carried out as follows.

[Measurement of Glass Transition Temperature]

The storage modulus of a liquid crystal polyester composition was measured by a dynamic viscoelasticity analyzer (manufactured by TA Instruments, Inc., "Q800"), and the glass transition temperature was measured from the peak of tan δ.

Measurement mode: tensile mode, amplitude: 20, frequency: 20 Hz, rate of temperature increase: 5° C./min.

[Measurement of Porosity]

In regard to the laminate film thus obtained, for each face of the surface of the toner layer and a cross section of the toner layer, the void area ratio was determined, and the porosity defined by the following formula (S1) was calculated. The void area ratio of the surface and the void area ratio of a cross section were determined for the surface and the cross section of the toner layer 2, by performing binary image processing by an image analyzing device (manufactured by Nireco Corporation, "LUZEX (registered trademark)"). Specifically, the void area ratio of the surface and the void area ratios of two cross sections orthogonally intersecting each other were calculated from two-dimensional images obtained by the image analyzing device. In regard to this measurement, the void area ratio is a value, expressed in percentage, representing the proportion of the area of voids with respect to a measurement area of 0.4 mm² for the known image analyzing device.

The cross sections orthogonally intersecting each other were formed by cutting an area near the center of the toner layer with a cutter knife. The MD and the TD of the laminate film were employed as the cutting directions. The MD represents the direction of coating of the toner, and the TD represents a direction orthogonal to the direction of coating of the toner.

$$\text{Porosity (\%)} = \frac{\text{Void area ratio of cross section (\%)}}{100} \times \frac{\text{Void area ratio of surface (\%)}}{100} \times 100 \quad \text{(S1)}$$

[Measurement of Reflectance]

The reflectance of the laminate film thus obtained at a wavelength of 550 nm was measured by a reflectance measuring device (manufactured by Hitachi, Ltd., "U-3500 type automatic recording spectrophotometer"). The reflectance of the laminate film was determined when the reflectance of a white plate made of aluminum oxide (manufactured by Hitachi High-Tech Fielding Corporation, component No.: 210-0740) was taken as 100%. Measurement conditions are shown below.

Measurement wavelength: 350 to 800 nm, slit: 6 nm, sampling interval: 1 nm, scan speed: 600 nm/min.

[Measurement of Reflectance after Heat Treatment]

The laminate film thus obtained was heat-treated for one minute at 260° C. in air. The reflectance of the laminate film after the heat treatment was measured in the same manner as described above.

Production Example 1034.99 g (5.5 mol) of 2-hydroxy-6-naphthoic acid, 378.33 g (1.75 mol) of 2,6-naphthalenedicarboxylic acid, 83.07 g (0.5 mol) of terephthalic acid, 272.52 g (2.475 mol: in excess by 0.225 mol with respect to the total mole number of 2,6-naphthalenedicarboxylic acid and terephthalic acid) of 1,4-benzenediol, 1226.87 g (12.0 mol) of acetic anhydride, and 0.17 g of 1-methylimidazole as a catalyst were introduced into a reactor equipped with a stirring device, a torque meter, a nitrogen gas introduction tube, a thermometer, and a reflux condenser. This mixture was stirred for 15 minutes at room temperature, and then temperature was increased up to 145° C. while the mixture was stirred. Then, the mixture was stirred for one hour at 145° C.

Next, while acetic acid distilled as a by-product and unreacted acetic anhydride were distilled off, temperature was increased from 145° C. to 310° C. over 3 hours and 30 minutes, and then the mixture was allowed to react for 3 hours at 310° C. This polymerization product (prepolymer) was cooled to room temperature and was pulverized by a pulverizer, and thus a powdered solid having a volume average particle size of about 0.4 mm was obtained. The flow starting temperature of this solid was measured using a flow tester (manufactured by Shimadzu Corporation, "CFT-500 type"), and as a result, the flow starting temperature was 267° C.

Next, this polymerization product was heated from 25° C. to 250° C. over one hour, and then the temperature was increased from 250° C. to 293° C. over 5 hours. The polymerization product was allowed to react for 5 hours at 293° C., and thereby solid-state polymerization was carried out. The reaction product obtained after solid-state polymerization was cooled, and a liquid crystal polyester in a powder form was obtained. The flow starting temperature of the powdered liquid crystal polyester was measured using a flow tester (manufactured by Shimadzu Corporation, "CFT-500 type"), and as a result, the flow starting temperature was 317° C.

The powdered liquid crystal polyester thus obtained was such that the content of a repeating unit (1) in which $Ar^1$ represented a 2,6-naphthylene group, that is, a repeating unit derived from 2-hydroxy-6-naphthoic acid, was 55 mol % with respect to the total mole number of all the repeating units.

The content of a repeating unit (2) in which $Ar^2$ represented a 2,6-naphthylene group, that is, a repeating unit derived from 2,6-naphthalenedicarboxylic acid, was 17.5 mol % with respect to the total mole number of all the repeating units.

The content of a repeating unit (2) in which $Ar^2$ represented a 1,4-phenylene group, that is, a repeating unit derived from terephthalic acid, was 5 mol % with respect to the total mole number of all the repeating units.

The content of a repeating unit (3) in which $Ar^3$ represented a 1,4-phenylene group, that is, a repeating unit derived from 1,4-benzenediol, was 22.5 mol % with respect to the total mole number of all the repeating units.

Therefore, the content of repeating units containing a 2,6-naphthylene group was 72.5 mol % with respect to the total mole number of all the repeating units.

100 parts by mass of the powdered liquid crystal polyester thus obtained was mixed with 1 part by mass of titanium oxide (manufactured by Ishihara Sangyo Kaisha, Ltd., "TIPAQUE CR-60") having a volume average particle size of 0.21 µm, and the mixture was granulated at 317° C. to 327° C. using a twin-screw extruder (manufactured by Ikegai Corporation, "PCM-30") and pelletized. For the liquid crystal polyester composition thus obtained, the glass transition temperature was measured using a dynamic viscoelasticity analyzer (Q800), and as a result, the glass transition temperature was 133° C. The pellets thus obtained were melted by supplying the pellets to a single-screw extruder (screw diameter 50 mm), and the molten material was extruded into a film form through a T-die (lip length 300 mm, lip clearance 1 mm, and die temperature 350° C.) and cooled. Thus, a resin layer formed from a liquid crystal polyester as the layer-forming material was obtained. The thickness of the resin layer was measured with a micrometer. Measurement was performed at any arbitrary nine points of the resin layer, and the average value thereof was 25 µm.

Production of Laminate Film

Example 1

A commercially available electrophotographic printer (manufactured by Samsung Group. "ML-3712ND") was modified such that the heating temperature of the fixing apparatus (fixing step) could be arbitrarily changed. The average particle size of the toner (white) was about 8 µm. The process of image forming (formation of toner layer) was repeated four times on one surface of the resin layer obtained in the Production Example, while the heating temperature of the fixing apparatus was controlled to be in the range of 160° C. to 170° C. That is, the five steps of charging, exposure, developing, transfer, and fixing in an electrophotographic method were carried out as one cycle, and this cycle was repeated four times for one resin layer. Thus, a laminate film of Example 1 was obtained.

Example 2

A laminate film of Example 2 was obtained in the same manner as in Example 1, except that the heating temperature of the fixing apparatus was controlled to be in the range of 140° C. to 150° C.

Example 3

A laminate film of Example 3 was obtained in the same manner as in Example 1, except that the heating temperature of the fixing apparatus was controlled to be in the range of 150° C. to 160° C.

Example 4

A laminate film of Example 4 was obtained in the same manner as in Example 1, except that the heating temperature of the fixing apparatus was controlled to be in the range of 150° C. to 160° C., and the number of times of image formation was changed to one time.

Example 5

A laminate film of Example 5 was obtained in the same manner as in Example 1, except that the heating temperature of the fixing apparatus was controlled to be in the range of 160° C. to 170° C., and the number of times of image formation was changed to one time.

Example 6

A laminate film of Example 6 was obtained in the same manner as in Example 1, except that the heating temperature of the fixing apparatus was controlled to be in the range of 140° C. to 150° C., and the number of times of image formation was changed to one time.

Comparative Example 1

Ordinary paper that is used in conventional electrophotographic methods was used instead of the laminate film of Example 1.

Comparative Example 2

The resin layer obtained in Production Example was used instead of the laminate film of Example 1.

In regard to the laminate films obtained in Examples 1 to 6, the void area ratio of the surface of the toner layer before a heat treatment, the void area ratios of two cross sections (cross section in the MD and cross section in the TD) orthogonally intersecting each other, and two porosities as calculated in accordance with the formula (S1) using the void area ratios of the two cross sections, are presented in Table 1. In Table 1, the value in the column for the porosity in the MD means the porosity calculated using the void area ratio of the cross section in the MD, and the value in the column for the porosity in the TD means the porosity calculated using the void area ratio of the cross section in the TD. In regard to the laminate films obtained in Examples 1 to 6, the ordinary paper of Comparative Example 1, and the resin layer of Comparative Example 2, the reflectances obtained before and after a heat treatment are presented together in Table 1.

TABLE 1

| | Heating temperature (° C.) | Number of times of image formation | Reflectance (%) Before heat treatment | Reflectance (%) After heat treatment | Void area ratio (%) Surface | Void area ratio (%) Cross section MD | Void area ratio (%) Cross section TD | Porosity (%) MD | Porosity (%) TD |
|---|---|---|---|---|---|---|---|---|---|
| Example 1 | 160~170 | 4 times | 83.9 | 83.9 | 4.1 | 3.0 | 3.3 | 0.12 | 0.14 |
| Example 2 | 140~150 | 4 times | 83.7 | 83.7 | 9.4 | 2.0 | 2.6 | 0.19 | 0.24 |
| Example 3 | 150~160 | 4 times | 85.8 | 85.8 | 10.4 | 2.5 | 3.5 | 0.26 | 0.36 |
| Example 4 | 150~160 | 1 time | 75.3 | 75.3 | 14.1 | 4.8 | 2.8 | 0.68 | 0.39 |
| Example 5 | 160~170 | 1 time | 73.7 | 73.7 | 14.5 | 2.9 | 2.8 | 0.42 | 0.41 |
| Example 6 | 140~150 | 1 time | 76.5 | 76.5 | 29.5 | 4.1 | 2.4 | 1.21 | 0.71 |
| Comparative Example 1 | | | 80.0 | 72.0 | | | | | |
| Comparative Example 2 | | | 73.9 | 72.4 | | | | | |

As shown in Table 1, it was found that the reflectances in the visible light region of the laminate films of Examples 1 to 6 before a heat treatment were satisfactory, and there was no decrease in the reflectance after a heat treatment. The porosities in the MD and the TD of the toner layers of the laminate films of Examples 1 to 3 were respectively in the range of from 0.01% to 0.40%, and the void area ratio of the surface was in the range of from 0.1% to 11%. It was found that the reflectances in the visible light region of these laminate films before a heat treatment were all as high as 83% or higher, and high reflectance was maintained even after a heat treatment.

On the other hand, the porosity in the TD of the toner layer of the laminate film of Example 4 was in the range of from 0.01% to 0.40%; however, the porosity in the MD was not in the range of from 0.01% to 0.40%. It was found that the reflectance in the visible light region of this laminate film before a heat treatment was low compared to the reflectances of the laminate films of Examples 1 to 3; however, the reflectances were maintained even after a heat treatment.

The porosities in the MD and the TD of the toner layers of the laminate films of Example 5 and Example 6 were not in the range of from 0.01% to 0.40%, and the void area ratios of the surface were not in the range of from 0.1% to 11%. It was found that the reflectances in the visible light region of these laminate films before a heat treatment were low compared to the reflectances of the laminate films of Examples 1 to 3; however, the reflectances were maintained even after a heat treatment.

Furthermore, in regard to the ordinary paper of Comparative Example 1, the reflectance in the visible light region before a heat treatment was 80%, which was sufficient; however, the reflectance in the visible light region after a heat treatment became 72%. Thus, it was found that the reflectance was decreased to a large extent by a heat treatment.

Furthermore, for the resin layer of Comparative Example 2, the reflectance in the visible light region before a heat treatment was 73.9%; however, it was found that the reflectance was decreased by 1% or more as a result of a heat treatment.

From the results shown above, it was confirmed that the invention is useful.

INDUSTRIAL APPLICABILITY

According to the present invention, a laminate film in which a decrease in the reflectance in the visible light region in a high temperature environment can be suppressed; a method for producing the laminate film; and a LED-mounted substrate to which the laminate film has been applied, can be provided.

Therefore, the present invention is industrially very important.

EXPLANATION OF REFERENCES 1 resin layer
2 toner layer
10 laminate film
11 metal layer
20 conductor pattern
30 bonding wire
100 LED-mounted substrate
200 LED (LED element)

What is claimed is:

1. A laminate film comprising:
a resin layer having a thickness of from 10 µm to 125 µm; and
a toner layer formed on one surface of the resin layer,
wherein the resin layer contains a resin material having a glass transition temperature of 130° C. or higher, and
the toner layer has a plurality of voids, wherein a void area ratio of the surface of the toner layer is from 0.1% to 11%, wherein the void area ratio is the percentage of a total area of the voids exposed on a surface of the toner layer relative to an area of the surface,
wherein the resin material is a liquid crystal polyester having a structural unit derived from a polyimide or a hydroxycarboxylic acid as a mesogenic group, and
wherein the liquid crystal polyester has repeating units represented by Formula (1) to Formula (3), and a content of repeating units containing a 2,6-naphthylene group is 40 mol % or more with respect to the total mole number of all the repeating units, —O-Ar1-CO—     (1)

—CO-Ar2-CO—     (2)

—X-Ar3-Y—     (3)

in Formula (1) to Formula (3), Ar1 to Ar3 each independently represent a phenylene group, a naphthylene group, or a biphenylene group; X and Y each independently represent an oxygen atom or an imino group; and one or more hydrogen atoms included in Ar1 to Ar3 is each independently and optionally substituted by a halogen atom, an alkyl group having 1 to 10 carbon atoms, or an aryl group having 6 to 20 carbon atoms.

2. The laminate film according to claim 1, wherein a porosity of the toner layer as calculated in accordance with the following formula (S1) using a void area ratio of a cross section orthogonal to the surface of the toner layer and the void area ratio of the surface, and
a porosity of the toner layer as calculated in accordance with the following formula (S1) using a void area ratio of a cross section orthogonal to both the cross section and the surface of the toner layer and the void area ratio of the surface, are both from 0.01% to 0.40%, $$\text{Porosity (\%)} = \frac{\text{Void area ratio of cross section (\%)}}{100} \times \frac{\text{Void area ratio of surface (\%)}}{100} \times 100 \quad \text{(S1)}$$

wherein,
the void area ratio of surface is the percentage of a total area of the voids exposed on a surface of the toner layer relative to an area of the surface, and
the void area ratio of cross section is the percentage of a total area of the voids exposed on a cross section of the toner layer relative to an area of the cross section.

3. The laminate film according to claim 1, wherein the toner layer is a white toner layer.

4. The laminate film according to claim 1, wherein the resin is a liquid crystal polyester having a structural unit derived from a hydroxycarboxylic acid as a mesogenic group.

5. The laminate film according to claim 1, wherein the liquid crystal polyester contains a structural unit derived from 4-hydroxybenzoic acid or 2-hydroxy-6-naphthoic acid.

6. The laminate film according to claim 1, wherein the repeating unit represented by Formula (1) is a repeating unit represented by Formula (11), the repeating unit represented by Formula (2) is a repeating unit represented by Formula (21), and the repeating unit represented by Formula (3) is a repeating unit represented by Formula (31), —O—Ar$^{11}$—CO—     (11)

—CO—Ar$^{21}$—CO—     (21)

—O—Ar$^{31}$—O—     (31)

in Formula (11), Formula (21), and Formula (31), Ar$^{11}$, Ar$^{21}$, and Ar$^{31}$ each independently represent a 1,4-phenylene group, a 1,3-phenylene group, a 2,6-naphthylene group, or a 4,4'-biphenylene group; and one or more hydrogen atoms included in Ar$^{11}$, Ar$^{21}$, and Ar$^{31}$ is each independently and optionally substituted by a halogen atom, an alkyl group having 1 to 10 carbon atoms, or an aryl group having 6 to 20 carbon atoms.

7. A LED-mounted substrate comprising:
the laminate film according to claim 1;
a conductor pattern provided on the laminate film; and
a LED element connected to the conductor pattern.

8. A method for producing a laminate film, the method comprising:
forming a toner layer having a plurality of voids on one surface of a resin layer by an electrophotographic method, the resin layer containing a resin material having a glass transition temperature of 130° C. or higher, wherein a void area ratio of the surface of the toner layer is from 0.1% to 11%, wherein the void area ratio is the percentage of a total area of the voids exposed on a surface of the toner layer relative to an area of the surface
wherein the resin material is a liquid crystal polyester having a structural unit derived from a polyimide or a hydroxycarboxylic acid as a mesogenic group, and
wherein the liquid crystal polyester has repeating units represented by Formula (1) to Formula (3), and a content of repeating units containing a 2,6-naphthylene group is 40 mol % or more with respect to the total mole number of all the repeating units, —O-Ar1-CO— (1)

—CO-Ar2-CO— (2)

—X-Ar3-Y— (3)

in Formula (1) to Formula (3), Ar1 to Ar3 each independently represent a phenylene group, a naphthylene group, or a biphenylene group; X and Y each independently represent an oxygen atom or an imino group; and one or more hydrogen atoms included in Ar1 to Ar3 is each independently and optionally substituted by a halogen atom, an alkyl group having 1 to 10 carbon atoms, or an aryl group having 6 to 20 carbon atoms.

* * * * *